United States Patent
Chae

(10) Patent No.: US 9,741,401 B2
(45) Date of Patent: Aug. 22, 2017

(54) RECEPTION CIRCUIT FOR REDUCING CURRENT AND ELECTRONIC APPARATUS INCLUDING THE SAME

(71) Applicant: SK hynix Inc., Icheon-si, Gyeonggi-do (KR)

(72) Inventor: Haeng Seon Chae, Yongin-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/062,961

(22) Filed: Mar. 7, 2016

(65) Prior Publication Data

US 2017/0110162 A1    Apr. 20, 2017

(30) Foreign Application Priority Data

Oct. 16, 2015    (KR) .................. 10-2015-0144982

(51) Int. Cl.
G11C 7/00 (2006.01)
G11C 7/10 (2006.01)
G11C 7/22 (2006.01)
G11C 11/4076 (2006.01)

(52) U.S. Cl.
CPC .............. *G11C 7/1051* (2013.01); *G11C 7/22* (2013.01); *G11C 11/4076* (2013.01)

(58) Field of Classification Search
CPC ......... G11C 7/222; G11C 7/22; G11C 7/1051; G11C 11/4076; H03L 7/089; H03L 7/00

USPC ....... 365/189.05, 194, 233.12; 327/142, 156, 327/158

See application file for complete search history.

(56) References Cited

U.S. PATENT DOCUMENTS

| 2002/0191480 A1 | 12/2002 | Matsumoto et al. | |
| 2010/0141321 A1* | 6/2010 | Hwang | G11C 8/06 327/199 |
| 2013/0106478 A1* | 5/2013 | Moon | H03L 7/0814 327/161 |
| 2014/0313847 A1* | 10/2014 | Jeong | G11C 8/18 365/233.12 |

FOREIGN PATENT DOCUMENTS

KR    1020020095066 A    12/2002

\* cited by examiner

*Primary Examiner* — David Lam
(74) *Attorney, Agent, or Firm* — William Park & Associates Ltd.

(57) ABSTRACT

Provided is a reception circuit provided in a chip, the reception circuit including a controller that generates a reception control signal which is activated for a preset time on a basis of a first control signal individually provided to a plurality of chips, a buffer that receives a second control signal commonly provided to the plurality of chips, and a delay circuit that receives the second control signal from the buffer in response to the reception control signal and provides the second control signal to other elements in the chip.

13 Claims, 7 Drawing Sheets

RECEPTION CIRCUIT FOR REDUCING CURRENT AND ELECTRONIC APPARATUS INCLUDING THE SAME

CROSS-REFERENCES TO RELATED APPLICATION

The present application claims priority under 35 U.S.C. §119(a) to Korean application number 10-2015-0144982, filed on Oct. 16, 2015, in the Korean Intellectual Property Office, which is incorporated herein by reference in its entirety.

BACKGROUND

Technical Field

Various embodiments generally relate to a reception circuit and an electronic apparatus including the same.

Description of Related Art

In an electronic apparatus, there is a plurality of chips. Also, the electronic apparatus comprises control signals sent to the plurality of chips, where the control signal is a different signal to each chip, and an other control signal sent to the plurality of chips, where the control signal is the same signal to each chip.

The plurality of chips receive signals provided from exterior through pins. The signals received through the pins are stabilized by a buffer and a delay circuit having RC delay, which are then provided to elements in the chips.

However, even when a corresponding chip does not operate, power may be unnecessarily consumed as signals that are commonly provided (i.e., each chip receiving the signal in the same way) to the plurality of chips are continuously received in the chips.

SUMMARY

In an embodiment, a reception circuit may be provided in a chip. The reception circuit may include a controller configured to generate a reception control signal based on a first control signal; and a delay circuit configured to receive the second control signal from the buffer in response to the reception control signal and provides the second control signal to other elements in the chip.

In an embodiment, an electronic apparatus may include a system control circuit configured to generate a plurality of first control signals individually provided to a plurality of chips and a second control signal commonly and simultaneously provided to the plurality of chips; and the plurality of chips each including a reception circuit that generates a reception control signal in response to the first control signal and selectively receives the second control signal in response to the reception control signal.

DETAILED DESCRIPTION

In a reception circuit according to various embodiments, a signal commonly provided to the plurality of chips is only received when a corresponding chip has been selected from a plurality of chips. That is, the signal is received only when the corresponding chip is operating, which reduces the consumption of power.

An electronic apparatus including a reception circuit according to various embodiments includes a plurality of chips each having the reception circuit. The reception circuits provided in the electronic apparatus perform an operation for receiving a signal only when a chip has been selected, so that internal power consumption can be minimized.

Hereinafter, a reception circuit and an electronic apparatus including the same will be described below with reference to the accompanying drawings through various examples of embodiments.

Figure 1:
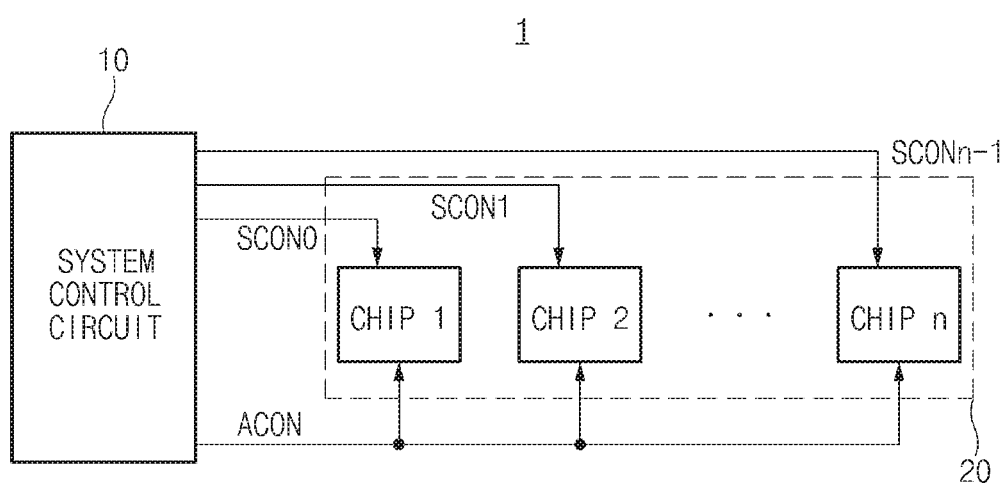
FIG. 1 is a diagram illustrating an electronic apparatus according to an embodiment.

FIG. 1 is a diagram illustrating an electronic apparatus according to an embodiment.

Referring to FIG. 1, an electronic apparatus 1 may include a system control circuit 10, a plurality of chips 20, and a plurality of nodes 30.

The system control circuit 10 and the plurality of chips 20 may be mounted on substantially the same printed circuit board. The system control circuit 10 and the plurality of chips 20 may also exchange signals through pins formed in the printed circuit board and metal interconnections, the metal interconnections being coupled among the pins.

The system control circuit 10 and the plurality of chips 20 may exchange various signals, such as data, a control signal and the like. For example, the plurality of chips 20 may include a volatile or nonvolatile memory for storing data. The plurality of chips 20 may receive data from the system control circuit 10 and write the data at a specific position according to the control signal. However, a control signal may also be received by the system control circuit 10 from the plurality of chips 20, and data written in the plurality of chips 20 may also be provided to the system control circuit 10.

Signals provided to the plurality of chips 20 from the system control circuit 10 may be provided to the plurality of chips 20 in various schemes. The system control circuit 10 may provide the plurality of chips 20 with individual control signals SCON0, SCON1, ..., SCONn−1 independently and respectively. Therefore, the individual control signals SCON0, SCON1, ..., SCONn−1 may be activated at substantially the same time point when the individual control signals SCON0, SCON1, ..., SCONn−1 are provided respectively or not at the same time point when the individual control signals SCON0, SCON1, ..., SCONn−1 are provided independently.

The system control circuit 10 may provide the plurality of chips 20 with a comprehensive control signal ACON. The comprehensive control signal ACON may have substantially the same value applied to each of the plurality of chips 20. The comprehensive control signal ACON may be provided to the plurality of chips 20 in substantially the same manner. However, according to embodiments, the comprehensive control signal ACON may be provided to each chip while having different delay times according to the positioning and arrangement of the plurality of chips 20. The comprehensive control signal ACON may also have a parasitic component based on an interconnection coupled to each chip from the system control circuit 10.

According an embodiment, the individual control signals SCON0, SCON1, . . . , SCONn-1 may correspond to a chip select signal for selecting each chip, and the comprehensive control signal ACON may correspond to a command address signal indicating a command for an operation of each chip and an address in which a corresponding operation should be performed.

Each chip may be activated according to the individual control signals SCON0, SCON1, . . . , SCONn-1. Although a first chip has been activated and the rest of the chips, second to $n^{th}$, have been deactivated, that is, even in the case of a standby state, based on the individual control signals SCON0, SCON1, . . . , SCONn-1, a current may be consumed. This may be the case because the comprehensive control signal ACON is provided to all the plurality of chips 20, and the plurality of chips 20 receive the comprehensive control signal ACON.

Based on recent electronic appliances in the market, when an electronic appliance's comprehensive control signal ACON changes fast with an increase in operation speed, chips in a deactivated state may consume significantly more power according to the comprehensive control signal ACON.

The electronic apparatus 1 according to the embodiment generates a reception control signal such that each chip receives the comprehensive control signal ACON only at a specific time point. The reception control signal is activated during a predetermined time when a corresponding chip is selected or a command for activating the corresponding chip is applied.

Since the plurality of chips 20 receive the comprehensive control signal ACON only when a reception control signal generated therein has been activated, the plurality of chips 20 do not receive the comprehensive control signal ACON when the reception control signal has not been activated. Since receiving the comprehensive control signal ACON consumes power, it is possible to reduce power consumption by preventing chips in a standby state from unnecessarily receiving the comprehensive control signal ACON.

Figure 2:
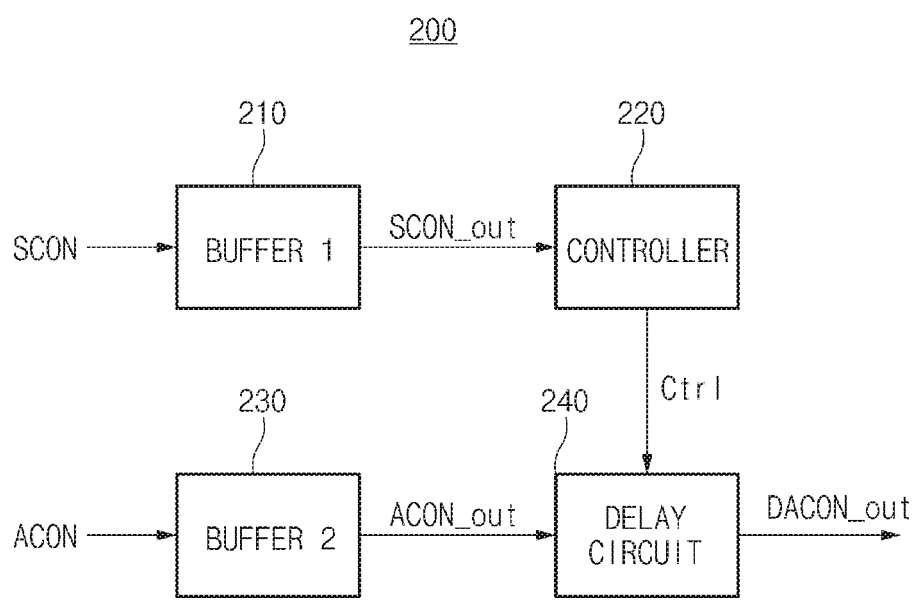
FIG. 2 is a block diagram illustrating a reception circuit according to an embodiment.

FIG. 2 is a block diagram illustrating a reception circuit according to an embodiment.

Referring to FIG. 2, a reception circuit 200 according to the embodiment may include a first buffer 210, a controller 220, a second buffer 230, and a delay circuit 240.

The reception circuit 200 may be provided in each of the plurality of chips 20 of FIG. 1. As described above, the plurality of chips 20 may receive the individual control signals SCON0, SCON1, . . . , SCONn-1 having different values at substantially the same time point. Hereinafter, for the purpose of convenience, one reception circuit 200 which is included in each chip will be described, and the individual control signal received in each chip will be described using a reference numeral "SCON".

The first buffer 210 and second buffer 230 may receive an individual control signal SCON and the comprehensive control signal ACON, respectively, and may output an outputted individual control signal SCON_out and an outputted comprehensive control signal ACON_out, respectively.

The first buffer 210 and the second buffer 230 may include a pull-up element and a pull-down element coupled between voltages having values corresponding to a logic state "low" and a logic state "high".

The controller 220 substantially maintains a value of the outputted individual control signal SCON_out during a preset time to generate a reception control signal Ctrl in response to the individual control signal SCON_out outputted from the first buffer 210. In other words, the controller 220 detects a time point at which the outputted individual control signal SCON_out is activated and generates the reception control signal Ctrl that is activated during a preset time from the activation time point.

The delay circuit 240 receives the comprehensive control signal ACON_out outputted from the second buffer 230. The delay circuit 240 may include an RC delay component. The delay circuit 240 may include a setup/hold delay circuit which includes the RC delay component, adjusts a voltage value of the outputted comprehensive control signal ACON_out to a predetermined level and stabilizes the outputted comprehensive control signal ACON_out, and simultaneously delays the outputted comprehensive control signal ACON_out during a predetermined time.

The delay circuit 240 selectively receives the outputted comprehensive control signal ACON_out based on the reception control signal Ctrl. For example, the delay circuit 240 may perform a logic operation based on the reception control signal Ctrl, receiving the outputted comprehensive control signal ACON_out only when the reception control signal Ctrl has been activated. For example, the delay circuit 240 may perform a NAND operation on the outputted comprehensive control signal ACON_out and the reception control signal Ctrl.

The delay circuit 240 may allow the outputted comprehensive control signal ACON_out to pass through the RC delay component only when the reception control signal Ctrl has been activated, thereby minimizing power consumption. When the outputted comprehensive control signal ACON_out passes through the RC delay component a delayed comprehensive control signal DACON_out is outputted. Although not seen in FIG. 2, the outputted comprehensive control signal ACON_out may be provided to other elements of the chip including the reception circuit 200.

For example, when the comprehensive control signal ACON, corresponding to a command address signal, passes through the RC delay component, the delayed comprehensive control signal DACON_out outputted from the delay circuit 240 may be provided to a command decoder and an address decoder.

Figure 3:
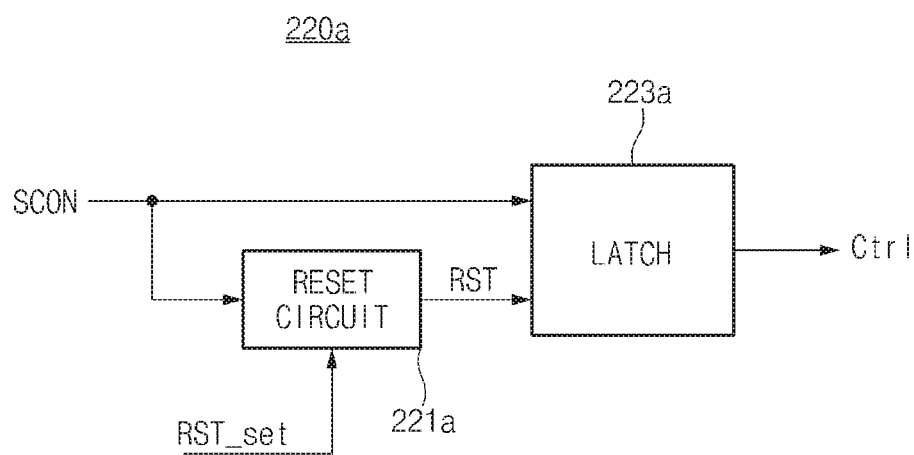
FIG. 3 is a block diagram illustrating a controller according to an embodiment.

FIG. 3 is a block diagram illustrating a controller according to an embodiment.

Referring to FIG. 3, a controller 220a may include a reset circuit 221a and a latch 223a. Referring to FIG. 2, the individual control signal SCON_out is outputted from the first buffer 210 and received by the controller 220. However, since the logic states of the individual control signal SCON_out and the outputted individual control signal SCON_out are substantially equal to each other unless there are special situations, a signal provided to the controllers 220a and 220b will be described as an individual control signal SCON in FIG. 3 to FIG. 6.

The reset circuit 221a receives a reset setting signal RST_set and the individual control signal SCON. The reset setting signal RST_set may be provided from the system control circuit 10 of FIG. 1, an external host, or a chip with the reception circuit 200.

The reset circuit 221a detects an activation time point of the individual control signal SCON, generates a reset signal RST when a time set by the reset setting signal RST_set passes from the activation time point, and provides the reset signal RST to the latch 223a.

The latch 223a may temporarily store and output the individual control signal SCON, and may output the reception control signal Ctrl according to a scheme that restricts the output of the reception control signal Ctrl in which the latch 223b is initialized according to the reset signal RST.

Figure 4:
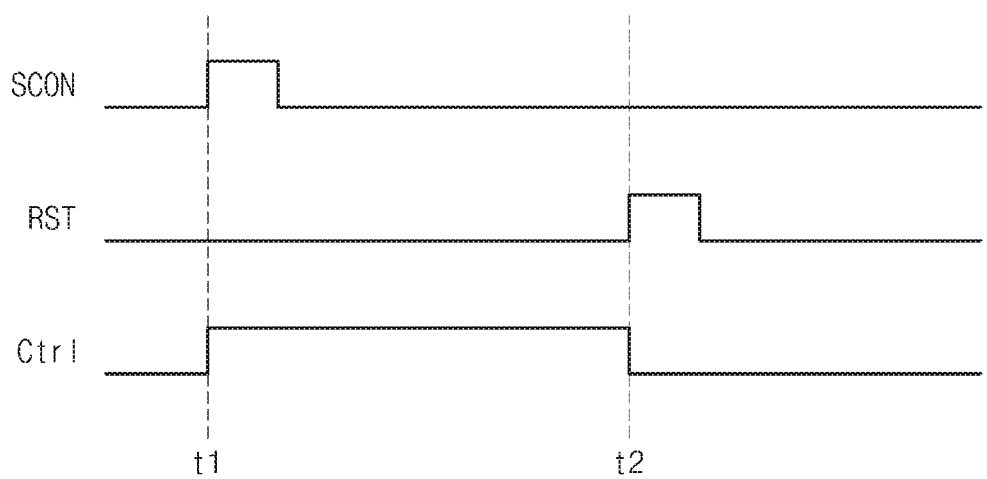
FIG. 4 is a waveform diagram explaining an operation of a controller according to an embodiment.

FIG. 4 is a waveform diagram explaining an operation of the controller according to an embodiment.

Referring to FIG. 4, it is possible to understand the operation of the controller 220a disclosed in FIG. 3. At a time point t1, as the individual control signal SCON is activated, the latch 223a outputs the value of the individual control signal SCON as the reception control signal Ctrl as is.

The reset circuit 221a generates the reset signal RST at a time point t2 having passed from the time point t1 by a preset time. A distance from the time point t2 to the time point t1 may be based on the reset setting signal RST_set, and may correspond to an RC delay time or a cycle of the comprehensive control signal ACON, which is provided to one chip, according to embodiments.

Before receiving the reset signal RST, the latch 223a has latched and has received the individual control signal SCON. In response to the reset signal RST generated at the time point t2, the latch 223a is then initialized. Accordingly, the reception control signal Ctrl is activated during the time point t1 to the time point t2.

Figure 5:
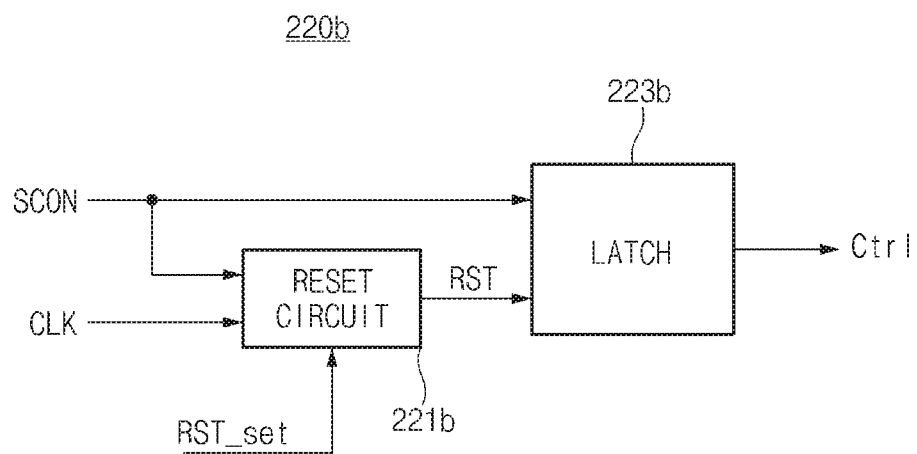
FIG. 5 is a block diagram illustrating a controller according to an embodiment.

FIG. 5 is a block diagram illustrating a controller according to an embodiment.

Referring to FIG. 5, a controller 220b may include a reset circuit 221b and a latch 223b.

As compared with the controller 220a described with reference to FIG. 3 and FIG. 4, the controller 220b illustrated in FIG. 5 is different from the controller 220a in that the reset signal RST is generated based on a clock signal CLK.

The reset circuit 221b, included in the controller 220b, detects the individual control signal SCON and starts to operate in response to the activation of the individual control signal SCON. The reset setting signal RST_set provided to the reset circuit 221b may be provided from the system control circuit 10 of FIG. 1, an external host, or a chip with the reception circuit 200.

The reset setting signal RST_set, provided to the controller 220b, may include information regarding the timing of the generation of the reset signal RST based on the number of cycles of the clock signal CLK.

The reset circuit 221b starts to operate according to the individual control signal SCON and then begins to count the number of cycles of the clock signal CLK. When a set amount of clock cycles indicated by the reset setting signal RST_set pass, the reset circuit 221b generates, that is, activates the reset signal RST.

For example, the reset setting signal RST_set may include cycle information substantially equal to a clock signal cycle of the command address signal. In such a case, the command address signal, which is one of the comprehensive control signal ACON provided to the plurality of chips 20, may be provided during some cycles of the clock signal CLK.

Accordingly, the reset circuit 221b may generate the reset signal RST such that the reception control signal Ctrl may be activated only during a cycle in which the comprehensive control signal ACON provided to chips is required.

The latch 223b may temporarily store and output the individual control signal SCON, and may output the reception control signal Ctrl according to a scheme that restricts the output of the reception control signal Ctrl in which the latch 223b is initialized according to the reset signal RST.

Figure 6:
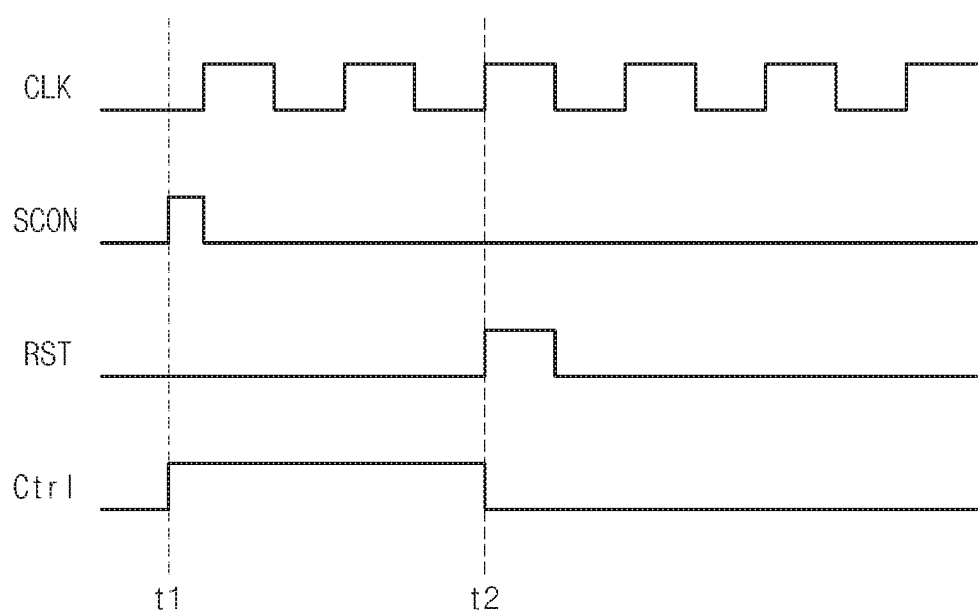
FIG. 6 is a waveform diagram explaining an operation of a controller according to an embodiment.

FIG. 6 is a waveform diagram explaining an operation of a controller according to an embodiment. FIG. 6 is a waveform diagram explaining an operation of the controller 220b illustrated in FIG. 5.

Referring to FIG. 6, at a time point t1, the latch 223b outputs the reception control signal Ctrl activated according to the value of the individual control signal SCON.

The reset circuit 221b starts to operate by detecting the value of the individual control signal SCON and detects a rising edge or a falling edge of the clock signal CLK, thereby recognizing the cycle of the clock signal CLK.

In FIG. 6, the following description will be provided on the assumption that the reset circuit 221b generates the reset signal RST after the clock signal CLK completes two cycles.

After starting to operate according to the individual control signal SCON, the reset circuit 221b detects the clock signal CLK of two cycles. After the individual control signal SCON is activated, the reset circuit 221b generates the reset signal RST and provides the reset signal RST to the latch 223b at a time point t2, the time at which the two cycles of the clock signal CLK have passed.

The latch 223b is initialized according to the reset signal RST, so that the reception control signal Ctrl may be activated from the time point t1 to the time point t2.

Figure 7:
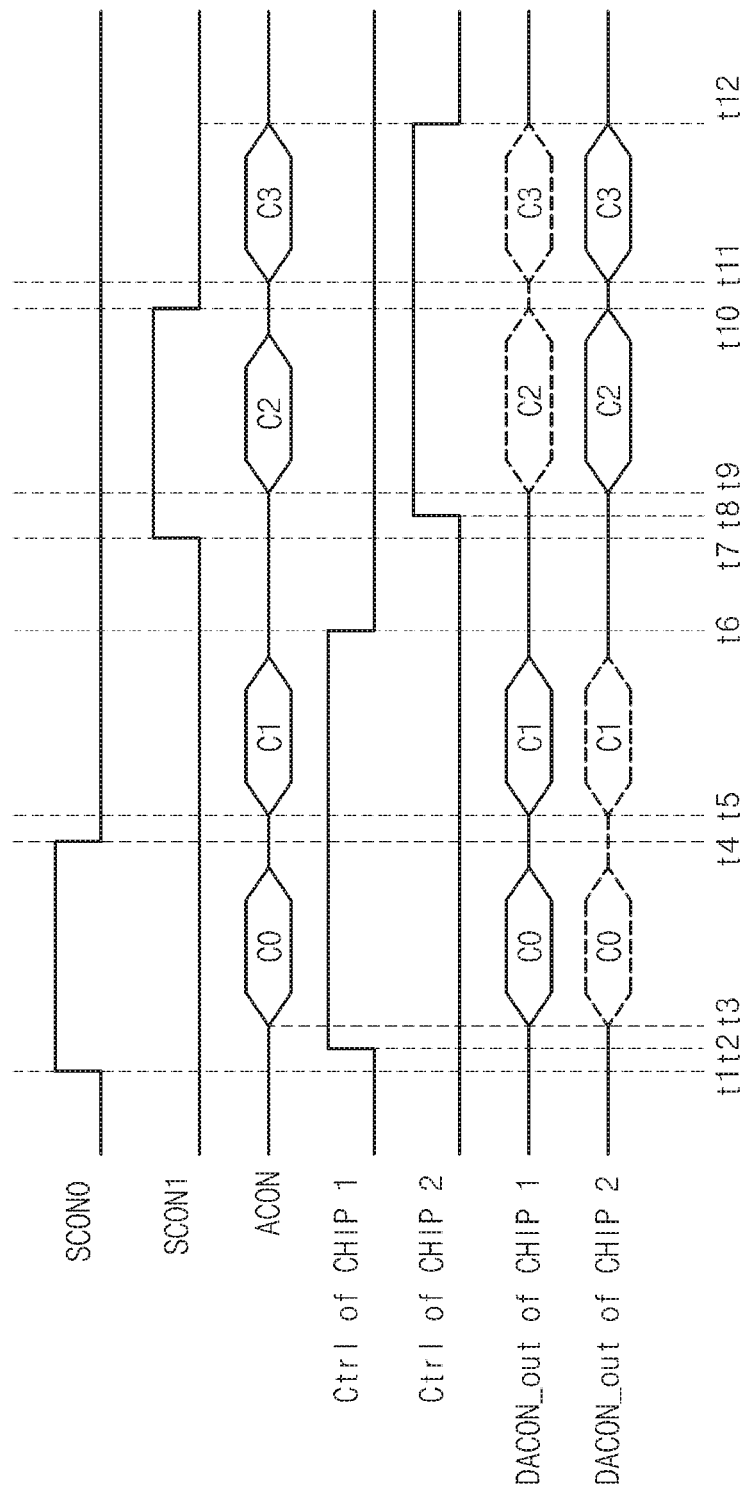
FIG. 7 is a waveform diagram explaining an operation of an electronic apparatus according to an embodiment.

FIG. 7 is a waveform diagram explaining an operation of the electronic apparatus according to an embodiment.

In FIG. 7, operations of the first chip and the second chip included in the electronic apparatus 1 of FIG. 1 will be described. However, FIG. 7 is merely an example as a plurality of chips may be included in the electronic apparatus according to the embodiment and the present disclosure is not limited only to the waveforms illustrated in FIG. 7.

Referring to FIG. 7, a first individual control signal SCON0 generated in the system control circuit 10 is provided to the first chip and a second individual control signal SCON1 is provided to the second chip. Furthermore, the comprehensive control signal ACON generated in the system control circuit 10 is simultaneously provided to the first chip and the second chip.

The system control circuit 10 provides the comprehensive control signal ACON to a plurality of chips, but an operation may be performed only for a specific chip based on the individual control signals SCON0 and SCON1.

At a time point t1, the first individual control signal SCON0 is activated, so that the operation of the first chip may be activated. The controller 220 included in the reception circuit 200 of the first chip may generate a reception control signal (Ctrl of the chip 1) which is activated after a preset time in response to the first individual control signal SCON0. According to embodiments, since the controller 220 may receive the first individual control signal SCON0 through a buffer, the reception control signal may be activated at a time point t2 slightly delayed from a time at which the first individual control signal SCON0 is activated.

At a time point t3, a first control value C0 may be provided to the comprehensive control signal ACON. Even though the first control value C0 is provided to both the first chip and the second chip, the first control value C0 is provided only to internal elements of the first chip as a delayed comprehensive control signal (DACON_out of the chip 1) because the reception control signal (Ctrl of the chip 1) of the first chip has been activated and the reception control signal (Ctrl of the chip 2) of the second chip has been deactivated.

The first control value C0 is not provided to internal elements of the second chip. Since the second individual control signal SCON1 has not been activated, the second chip does not operate. Accordingly, it is not necessary to perform an operation for receiving the first control value C0. In conventional reception circuits, even though the second chip does not need to operate, the first control value C0 is received, resulting in power consumption. However, in the reception circuit according to the present embodiment, only chips with the reception control signal activated perform an operation for receiving the comprehensive control signal ACON.

The first individual control signal SCON0 is deactivated at a time point t4, but a continuous time of the comprehensive control signal ACON for one chip may be set up to last until a time point t6. Accordingly, even when the first individual control signal SCON0 is deactivated at the time point t4, the reception control signal (Ctrl of the chip 1) of the first chip is activated up to the time point t6, so that a second control value C1 of a comprehensive control signal ACON generated at a time point t5 is also received only by the first chip and not received by the second chip.

The length of time for which the reception control signal is continued for one chip may be decided based on the reset setting signal RST_set, the characteristics of which having been described in FIG. 3 and FIG. 5. For example, the length of time the reception control signal is activated is from the time point t2 to the time point t6 (chip 1) and from a time point t8 to a time point t12 (chip 2) in FIG. 7.

After the first individual control signal SCON0 is deactivated, the second individual control signal SCON1 is activated at the time point t7. Accordingly, the first chip does not operate and the second chip operates.

As the second individual control signal SCON1 is activated, the reception control signal (Ctrl of the chip 2) of the second chip is activated at the time point t8.

A third control value C2 generated in the comprehensive control signal ACON at a time point t9 is received in the second chip in which the reception control signal has been activated and is provided to a delayed comprehensive control signal (DACON_out of the chip 2) of the second chip. The delay circuit 240 included in the first chip receives no comprehensive control signal based on the reception control signal of the first chip.

Even if the second individual control signal SCON1 is deactivated at a time point t10, the reception control signal (Ctrl of the chip 2) of the second chip substantially maintains an activated state for a preset time based on the reset setting signal RST_set and is initialized based on a reset signal RST generated at a time point t12, so that it may be deactivated.

Accordingly, a fourth control value C3 of a comprehensive control signal ACON provided at a time point t11 is received only in the second chip and not received in the first chip.

As described above, in the reception circuit 200 and the electronic apparatus 10 according to the embodiments of the present invention, a reception operation of a comprehensive control signal ACON commonly provided to a plurality of chips is controlled based on an individual control signal SCON respectively provided to the plurality of chips. To this end, the reception circuit 200 provided in each of the plurality of chips may be provided with the controllers 220, 220a, and 220b that generate a reception control signal which is activated for a preset time based on the individual control signal SCON and reset setting signal RST_set.

While various embodiments have been described above, it will be understood by those skilled in the art that the embodiments described are by way of example only. Accordingly, the data transfer device described herein should not be limited based on the described embodiments.

What is claimed is:

1. A reception circuit provided in a chip, comprising:
   a controller configured to generate a reception control signal based on a first control signal; and
   a delay circuit configured to receive a second control signal in response to the reception control signal and provide the second control signal to other elements in the chip,
   wherein the controller comprises:
   a reset circuit configured to generate a reset signal in response to the first control signal when a preset time passes; and
   a latch configured to temporarily store and output a value of the first control signal as the reception control signal, the output of the reception control signal being restricted by the initialization of the latch based on the reset signal.

2. The reception circuit of claim 1, further comprising:
   a first buffer configured to receive the first control signal, which is individually provided to a plurality of chips, and send the first control signal to the controller; and
   a second buffer configured to receive the second control signal, which is commonly provided to the plurality of chips, and send the second control signal to the delay circuit.

3. The reception circuit of claim 1, wherein the reception control signal is activated for a preset time.

4. The reception circuit of claim 1, wherein a reset setting signal determines the preset time before the reset signal is generated.

5. A reception circuit provided in a chip, comprising:
   a controller configured to generate a reception control signal based on a first control signal; and
   a delay circuit configured to receive a second control signal in response to the reception control signal and provide the second control signal to other elements in the chip,
   wherein the controller comprises:
   a reset circuit configured generate a reset signal in response to a passage of a preset number of cycles of a clock signal in response to the first control signal; and
   a latch configured to temporarily store and output a value of the first control signal as the reception control signal, the output of the reception control signal being restricted by the initialization of the latch based on the reset signal.

6. The reception circuit of claim 1, wherein the first control signal corresponds to a chip select signal.

7. The reception circuit of claim 1, wherein the second control signal corresponds to a command address signal.

8. The reception circuit of claim 1, wherein the delay circuit is configured to delay and output the second control signal only for a period in which the reception control signal has been activated.

9. The reception circuit of claim 5, further comprising:
   a first buffer configured to receive the first control signal, which is individually provided to a plurality of chips, and send the first control signal to the controller; and
   a second buffer configured to receive the second control signal, which is commonly provided to the plurality of chips, and send the second control signal to the delay circuit.

10. The reception circuit of claim 5, wherein the reception control signal is activated for a preset time.

11. The reception circuit of claim 5, wherein the first control signal corresponds to a chip select signal.

12. The reception circuit of claim 5, wherein the second control signal corresponds to a command address signal.

13. The reception circuit of claim 5, wherein the delay circuit is configured to delay and output the second control signal only for a period in which the reception control signal has been activated.

* * * * *